United States Patent
Sueyoshi et al.

(10) Patent No.: US 7,905,699 B2
(45) Date of Patent: Mar. 15, 2011

(54) TRANSFER ROBOT, TRANSFER METHOD, AND CONTROL METHOD

(75) Inventors: Satoshi Sueyoshi, Fukuoka (JP); Kentaro Tanaka, Fukuoka (JP); Tomohiro Matsuo, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 12/720,670

(22) Filed: Mar. 10, 2010

(65) Prior Publication Data

US 2010/0199797 A1    Aug. 12, 2010

Related U.S. Application Data

(63) Continuation of application No. PCT/JP2008/065491, filed on Aug. 29, 2008.

(30) Foreign Application Priority Data

Sep. 13, 2007   (JP) .................................. 2007-237500
Nov. 19, 2007   (JP) .................................. 2007-299120

(51) Int. Cl.
  *B25J 18/02* (2006.01)
(52) U.S. Cl. ...................... 414/744.5; 901/15; 74/490.01
(58) Field of Classification Search ............... 414/744.1, 414/744.3, 744.5; 901/15, 28, 29; 74/490.13, 74/490.15, 490.08, 490.06
  See application file for complete search history.

(56) References Cited

U.S. PATENT DOCUMENTS

| 5,571,325 A | 11/1996 | Ueyama et al. |
| 2002/0057955 A1 | 5/2002 | Tsubota et al. |
| 2004/0052626 A1 | 3/2004 | Oem et al. |

FOREIGN PATENT DOCUMENTS

| JP | 06-338555 | 12/1994 |
| JP | 07-050334 | 2/1995 |
| JP | 09-162257 | 6/1997 |
| JP | 11-188669 | 7/1999 |
| JP | 11-238779 | 8/1999 |
| JP | 2000-243809 | 9/2000 |
| JP | 2001-274218 | 10/2001 |
| JP | 2002-210684 | 7/2002 |
| JP | 2004-106167 | 4/2004 |
| JP | 2005-150575 | 6/2005 |
| JP | 2006-176276 | 7/2006 |

*Primary Examiner* — Donald Underwood
(74) *Attorney, Agent, or Firm* — Ditthavong Mori & Steiner, P.C.

(57) ABSTRACT

A transfer robot includes a hand section on which an object is placed; a horizontal arm mechanism connected to the hand section, the horizontal arm mechanism including at least two rotary joints, the horizontal arm mechanism extending and contracting so as to move the hand section along one direction, the horizontal arm mechanism being disposed so as to face in an axial direction; and a lift mechanism including a link mechanism that moves the horizontal arm mechanism up and down, wherein the lift mechanism includes at least two sets of link mechanisms disposed on a base member, and wherein the horizontal arm mechanism is disposed between parts of the lift mechanism when the horizontal arm mechanism is moved to a lowest position.

13 Claims, 6 Drawing Sheets

TRANSFER ROBOT, TRANSFER METHOD, AND CONTROL METHOD

CROSS-REFERENCE TO RELATED APPLICATIONS

The present application is a continuation application of PCT/JP2008/065491, filed Aug. 29, 2008, which claims priority to Japanese Patent Application No. 2007-237500, filed Sep. 13, 2007, and Japanese Patent Application No. 2007-299120, filed Nov. 19, 2007. The contents of these applications are incorporated herein by reference in their entirety.

BACKGROUND OF THE INVENTION

1. Field of the Invention

The present invention relates to a transfer robot that moves thin plate-shaped workpieces in and out of a cabinet. The present invention also relates to a transfer method and a control method for the transfer robot.

2. Discussion of the Background

Some existing transfer robots, which are described in Japanese Unexamined Patent Application Publication No. 11-238779, 2002-210684, and 2006-176276, move up and down by extending and contracting their legs and transfer a workpiece by using an arm disposed in an upper part of the robot.

SUMMARY OF THE INVENTION

According to one aspect of the present invention, a transfer robot includes a hand section on which an object is placed; a horizontal arm mechanism connected to the hand section, the horizontal arm mechanism including at least two rotary joints, the horizontal arm mechanism extending and contracting so as to move the hand section along one direction, the horizontal arm mechanism being disposed so as to face in an axial direction; and a lift mechanism that moves the horizontal arm mechanism up and down, wherein the lift mechanism includes at least two sets of link mechanisms disposed on a base member, and wherein the horizontal arm mechanism is disposed between parts of the lift mechanism when the horizontal arm mechanism is moved to a lowest position.

According to another aspect of the present invention, a transfer robot includes a hand section on which an object is placed; a horizontal arm mechanism connected to the hand section, the horizontal arm mechanism including at least two rotary joints, the horizontal arm mechanism extending and contracting so as to move the hand section along one direction, the horizontal arm mechanism being disposed so as to face in an axial direction; and a link mechanism that moves the horizontal arm mechanism up and down, wherein the horizontal arm mechanism is configured so that the hand section is disposed between a supporting base and a supporting member when the object has been taken out.

According to another aspect of the present invention, a transfer robot includes a hand section on which an object is placed; a horizontal arm mechanism connected to the hand section, the horizontal arm mechanism including at least two rotary joints, the horizontal arm mechanism extending and contracting so as to move the hand section along one direction, the horizontal arm mechanism being disposed so as to face in an axial direction; and a lift mechanism including a link mechanism that moves the horizontal arm mechanism up and down, wherein the lift mechanism includes at least two sets of link mechanisms disposed on a base member, and wherein, by rotatably positioning the rotary joints at a predetermined angle, the horizontal arm mechanism moves in one of a roll direction or a lateral direction with respect to a direction in which the hand section is moved.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
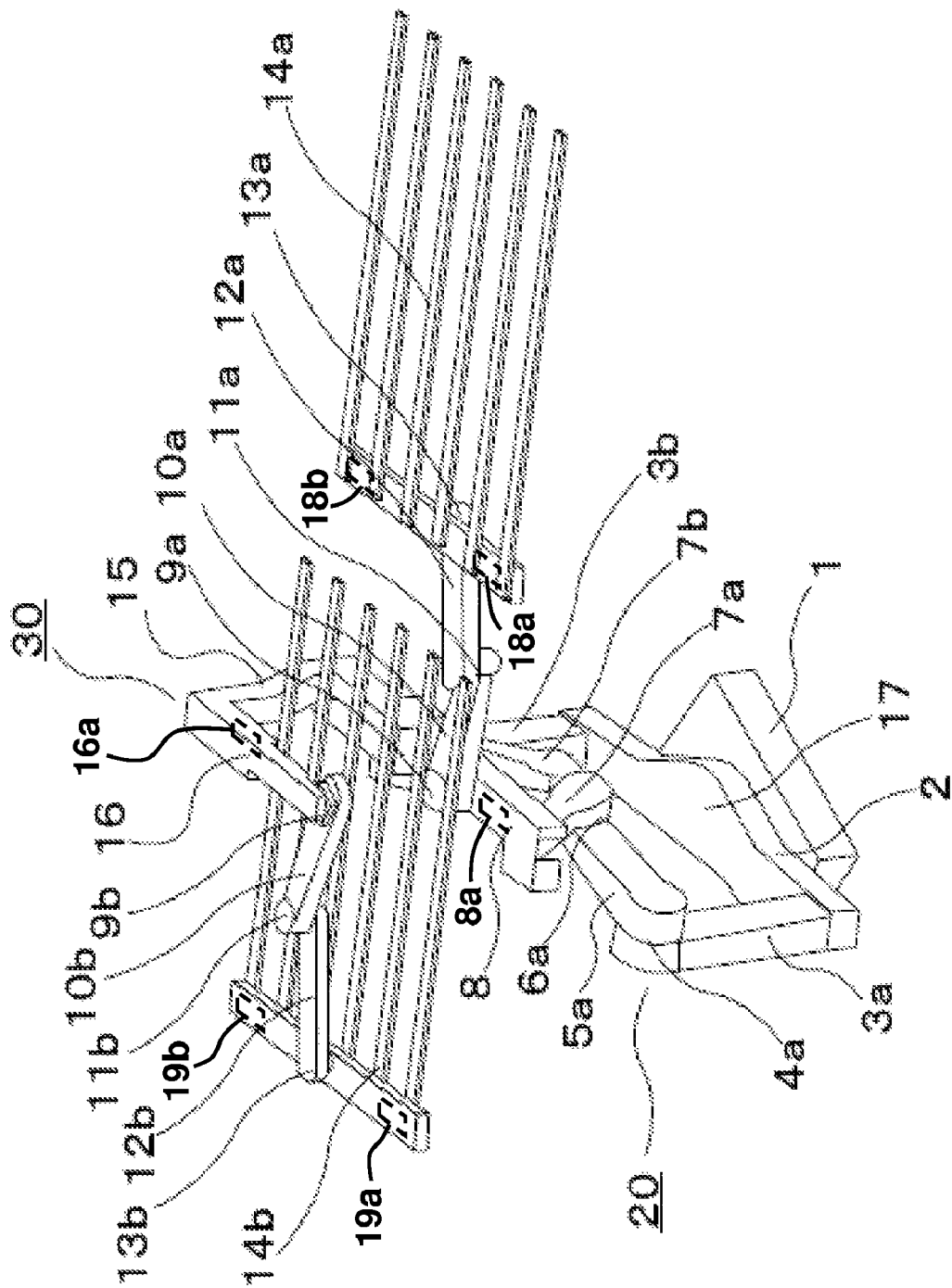
FIG. 1 is a perspective view of a transfer robot.

Embodiments will now be described with reference to the accompanying drawings, wherein like reference numerals designate corresponding or identical elements throughout the various drawings.

FIG. 1 is a perspective view of a transfer robot according to an embodiment of the present invention. The transfer robot includes a rotation mechanism 17, a lift mechanism 20, and a horizontal arm mechanism 30 so as to be capable of taking out a workpiece disposed in a cabinet (not shown) and transferring the workpiece to a work area.

The rotation mechanism 17 is disposed in such a manner that the rotation axis of the rotation mechanism 17 is disposed at substantially the center of a base 2 that is attached to a mounting base 1. Leg supporting members 3a and 3b are disposed at ends of the base 2.

The lift mechanism 20 has the following structure. The leg supporting members 3a and 3b include drive units (not shown) that drive first joints 4a and 4b. First ends of first leg sections 5a and 5b are connected to the first joints 4a and 4b. Second ends of the first leg sections 5a and 5b are connected to first ends of second leg sections 7a and 7b via second joints 6a and 6b that include drive units (not shown). Second ends of the second leg sections 7a and 7b are rotatably connected to a supporting base 8. The first leg sections 5a and 5b have a length greater than that of the leg supporting members 3a and 3b so as to be capable of reducing the height of the horizontal arm mechanism 30 when the horizontal arm mechanism 30 is at the lowest position. The second leg sections 7a and 7b have a length smaller than that of the first leg sections 5a and 5b so that lateral sides of the first leg sections 5a and 5b do not protrude from lateral sides of the leg supporting members 3a and 3b when the horizontal arm mechanism 30 is at the lowest position.

In the present embodiment, both the first joints and the second joints include drive units. However, the second joint may be driven by a drive unit for driving the first joint through a belt drive.

Next, the horizontal arm mechanism 30 will be described. The horizontal arm mechanism 30 includes a double-link mechanism that moves two hands 14a and 14b so as to move a workpiece (not shown) in and out of a cabinet. The hands 14a and 14b are moved in vertical directions in which the horizontal arm mechanism 30 is moved up and down by the lift mechanism 20. The hands 14a and 14b are also moved in directions perpendicular to the direction in which second horizontal joints extend when the hands 14a and 14b are retracted toward the lift mechanism 20. The hands 14a and 14b are linearly moved along one direction.

Details of the horizontal arm mechanism 30 will be described. A first end of a first arm section 10a is connected to a first horizontal joint 9a that is disposed on the supporting base 8 and that includes a drive mechanism (not shown). A second end of the first arm section 10a is connected to a first end of a second arm section 12a via a second horizontal joint 11a. A second end of the second arm section 12a is connected to the hand 14a via a third horizontal joint 13a.

A supporting column 15 including a supporting member 16 is attached to the supporting base 8. A first end of a first arm section 10b is connected to the supporting column 15 via a first horizontal joint 9b that is disposed on the supporting base 8 and that includes a drive mechanism (not shown). A second end of the first arm section 10b is connected to a first end of a second arm section 12b via a second horizontal joint 11b. A second end of the second arm section 12b is connected to the hand 14b via a third horizontal joint 13b. The first arm sections 10a and 10b and the second arm sections 12a and 12b face each other and form a facing structure. In the present embodiment, the first horizontal joints 9a and 9b are coaxially disposed so as to face each other in the vertical direction. However, even if the first horizontal joints 9a and 9b are disposed offset from each other with respect to the direction in which the hands 14a and 14b are moved, movement the same as that of the present embodiment can be performed by changing the lengths of the first arm sections 10a and 10b and the second arm sections 12a and 12b. The first horizontal joints 9a and 9b and the third horizontal joints 13a and 13b are disposed on a line with respect to the direction in which the hands 14a and 14b are moved. When the hands 14a and 14b vertically overlap each other, the first horizontal joints 9a and 9b and the third horizontal joints 13a and 13b are disposed vertically coaxial with each other.

In the present embodiment, the rotation axes of the first horizontal joints 9a and 9b are forwardly offset from the rotation axis of the rotation mechanism 17 with respect to the direction in which the hands are moved, so that interference with the rotation mechanism 17 can be avoided. However, even if the rotation axes of the first horizontal joints 9a and 9b are offset in any of forward, backward, left, and right directions with respect to the direction in which the hands 14a and 14b are moved, movement the same as that of the present embodiment can be performed by changing the lengths of the first arm sections 10a and 10b and the second arm sections 12a and 12b.

Figure 2:
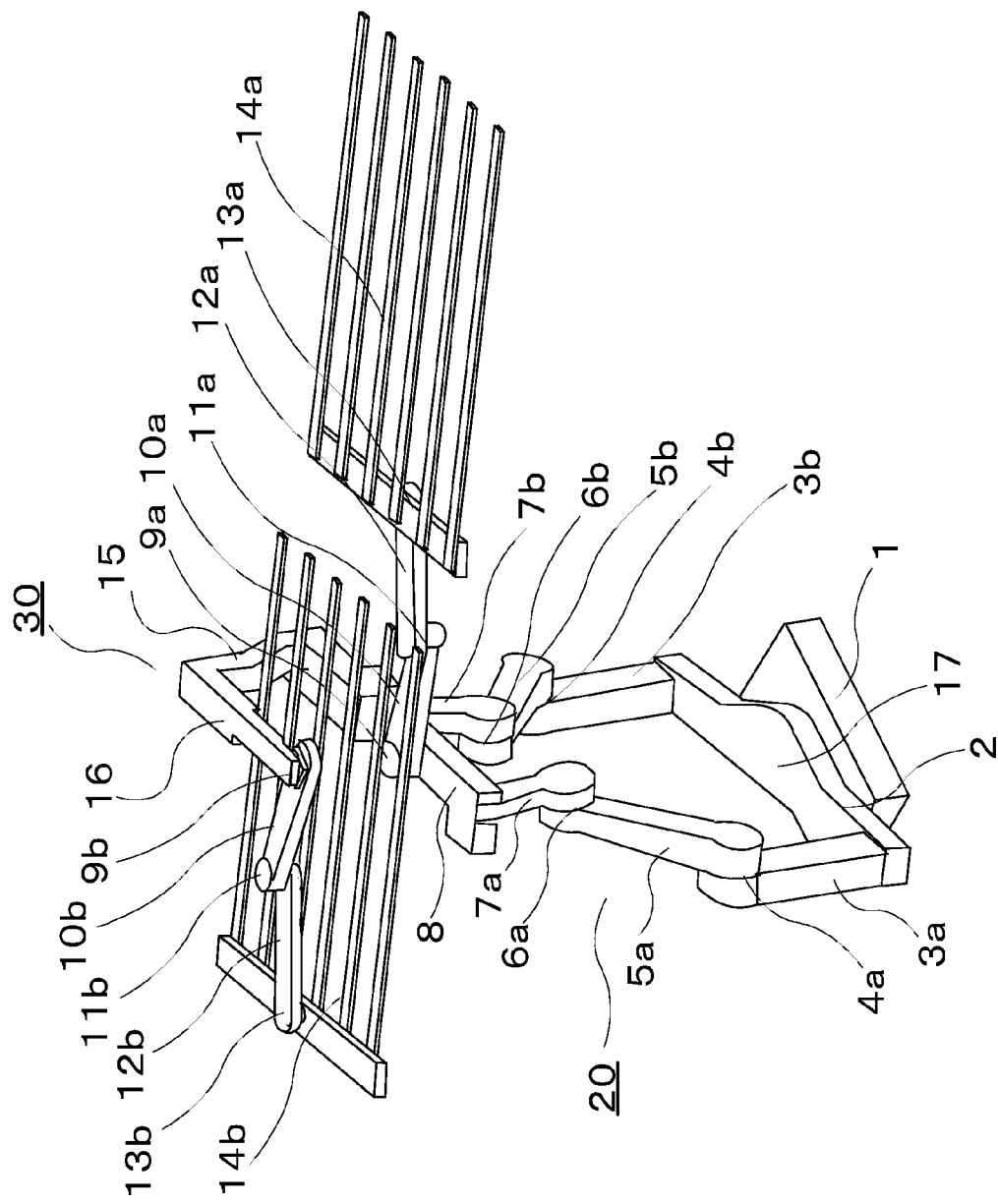
FIG. 2 is a perspective view illustrating a state in which a horizontal arm mechanism is at the highest position.
Figure 3:
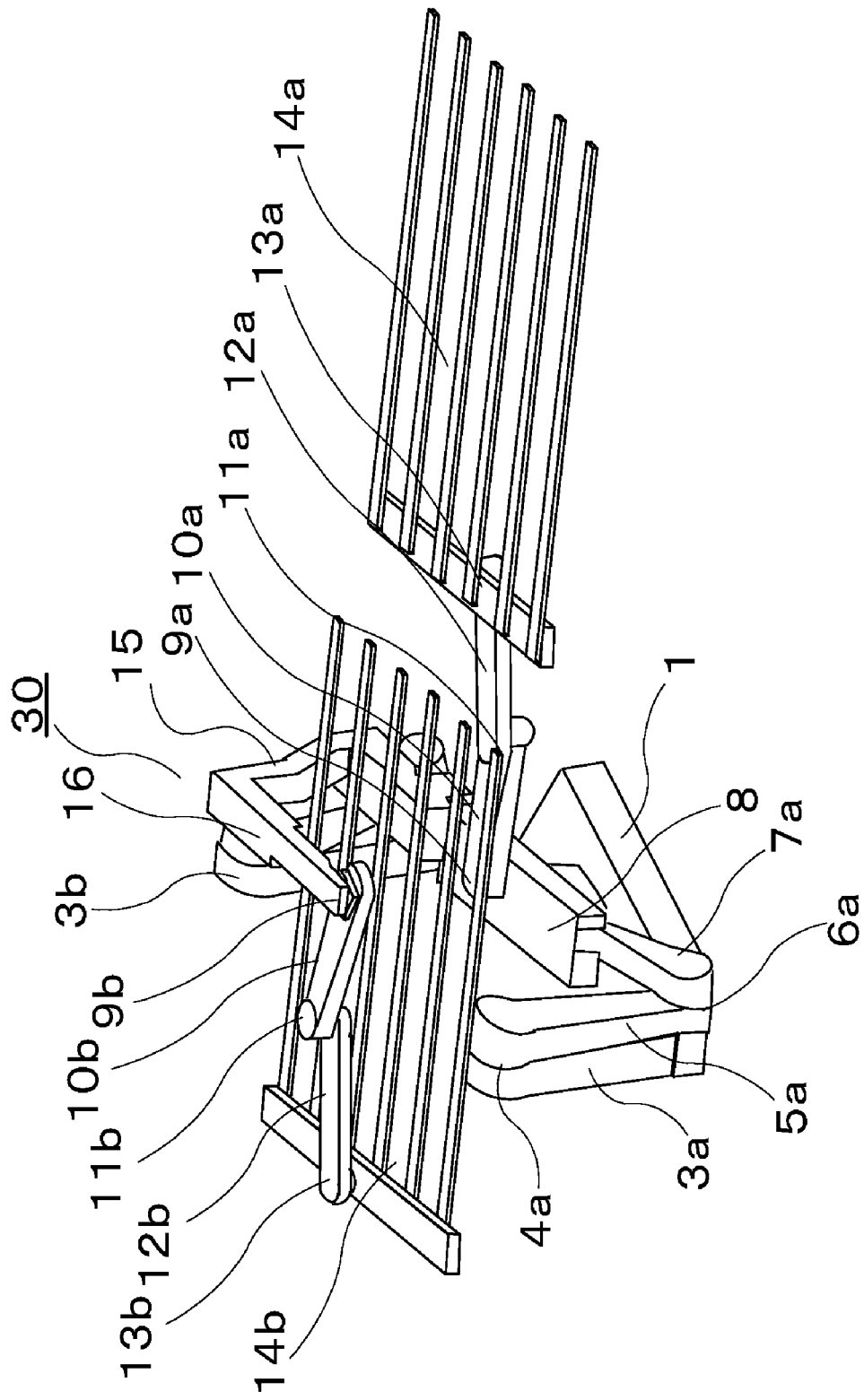
FIG. 3 is a perspective view illustrating a state in which the horizontal arm mechanism is at the lowest position.

Next, movement will be described. First, referring to FIGS. 2 and 3, movement of the lift mechanism will be described. FIG. 2 illustrates a state in which the lift mechanism 20 is at the highest position. FIG. 3 illustrates a state in which the lift mechanism 20 is at the lowest position. One part of the lift mechanism will be described, and description of the other part will be omitted because the other part is plane-symmetric therewith.

Referring to FIGS. 1 and 2, a case in which the lift mechanism is moved to the highest position will be described. Drive mechanisms (not shown), which include motors and the like, of the first joint 4a and the second joint 6a are driven. The first leg section 5a rotates counterclockwise around the first joint 4a, viewed from the direction in which the hand 14a is moved. The second leg section 7a rotates clockwise around the second joint 6a. Thus, the horizontal arm mechanism 30 is moved to the highest position.

Referring to FIGS. 1 and 3, a case in which the lift mechanism is moved to the lowest position will be described. Drive mechanisms (not shown), which include motors and the like, of the first joint 4a and the second joint 6a are driven. The first leg section 5a rotates clockwise around the first joint 4a, viewed from the direction in which the hand 14a is moved. The second leg section 7a rotates counterclockwise around the second joint 6a. Thus, the horizontal arm mechanism 30 is lowered. When the first leg section 5a is at a height the same as that of a surface of the base 2, the first leg section 5a further rotates clockwise around the first joint 4a to such an extent that a lateral side of the first leg section 5a does not considerably protrude from a lateral side of the leg supporting member 3a. The second leg section 7a rotates clockwise around the second joint 6a to the highest position.

When the horizontal arm mechanism 30 has been moved to the lowest position, the horizontal arm mechanism 30 is disposed between parts of the lift mechanism 20. Thus, a workpiece disposed at the lowest position of the cabinet (not shown) can be taken out with the hand 14a attached to the supporting base 8.

Even if one part of the lift mechanism 20 breaks down, the other part of the lift mechanism 20 can drive the horizontal arm mechanism. Therefore, the horizontal arm mechanism can be safely moved to the lowest position without being dropped, so that a workpiece is prevented from being damaged.

The diameter of the rotation area is equal to the distance from the axis of the rotation mechanism 17 to lateral sides of the leg supporting members 3a and 3b. Thus, a comparatively small installation space can be realized.

Next, referring to FIG. 4, correction movement performed by the lift mechanism when the cabinet is disposed at an angle in a roll direction with respect to the direction in which the hand is moved will be described.

Directions of inclination will be described below. The roll direction is the direction of rotation around an axis extending in the direction in which the hand is moved. A yaw direction (described below) is the direction of rotation around an axis along which the lift mechanism vertically moves up and down.

Figure 4:
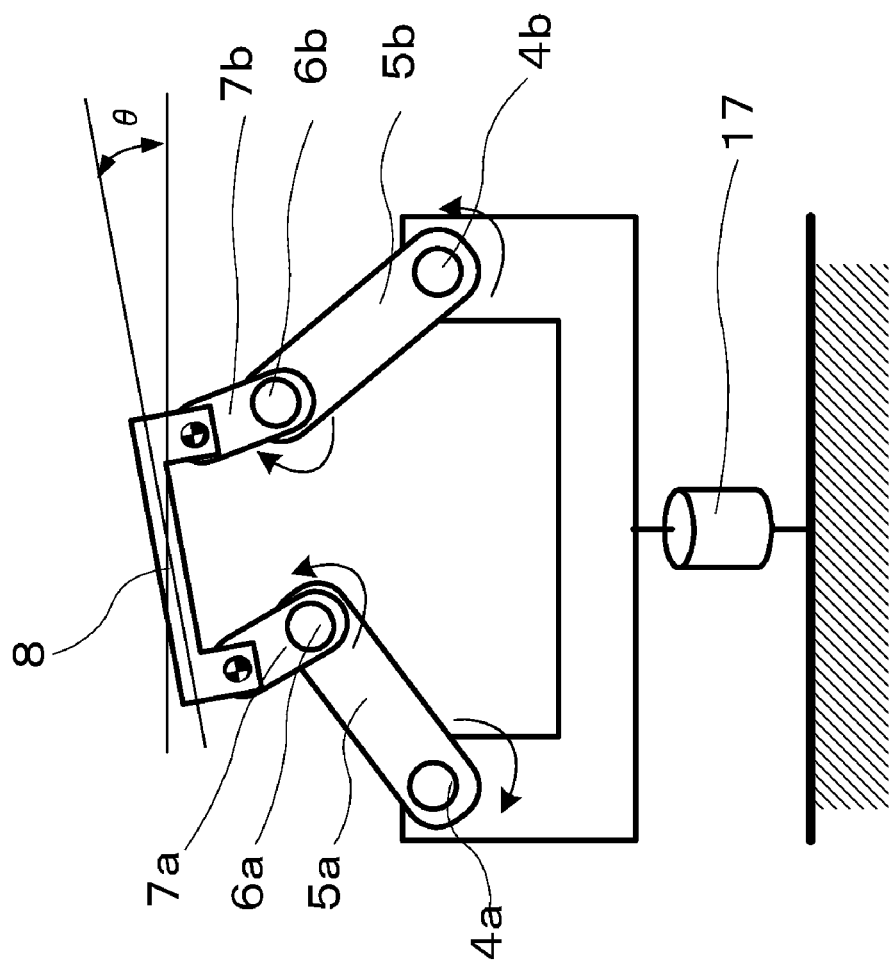
FIG. 4 is a schematic view illustrating movement of a lift mechanism for correcting displacement in the roll direction according to the present invention.

FIG. 4 is a schematic view of the lift mechanism viewed from the direction in which a workpiece is transferred to the cabinet.

When the cabinet is disposed at an angle θ, the first joint 4a is rotated clockwise so as to rotate the first leg section 5a by the angle θ from a horizontal state, and the second joint 6a is rotated counterclockwise so as to rotate the second leg section 7a by the angle θ from a horizontal state. The first joint 4b is rotated counterclockwise so as to rotate the first leg section 5b by the angle θ from a horizontal state, and the second joint 6b is rotated clockwise so as to rotate the second leg section 7b by the angle θ from a horizontal state. Thus, the supporting base 8 is held in a state inclined at the angle θ relative to a horizontal state. A horizontal arm mechanism (not shown) disposed on the supporting base 8 is held in a state inclined at the angle θ relative to a horizontal state.

In order to correct such an inclination, for example, an operator manually corrects the inclination using a pendant when the operator teaches the transfer robot the movement for taking out a workpiece from the cabinet and transferring the workpiece. Once the movement has been taught, the transfer robot moves on substantially the same trajectory when transferring a workpiece.

Next, correction movement that is performed when the cabinet is disposed at an angle in the yaw direction with respect to the direction in which the hand is moved will be described. In order to correct such an inclination, for example, an operator manually corrects the inclination using a pendant when the user teaches the transfer robot movement for taking out a workpiece from the cabinet and transferring the workpiece. At this time, correction movement is made around an axis to a predetermined angle by the rotation mechanism 17 illustrated in FIG. 4. Once the movement has been taught, the transfer robot moves on substantially the same trajectory when transferring a workpiece.

Figure 5:
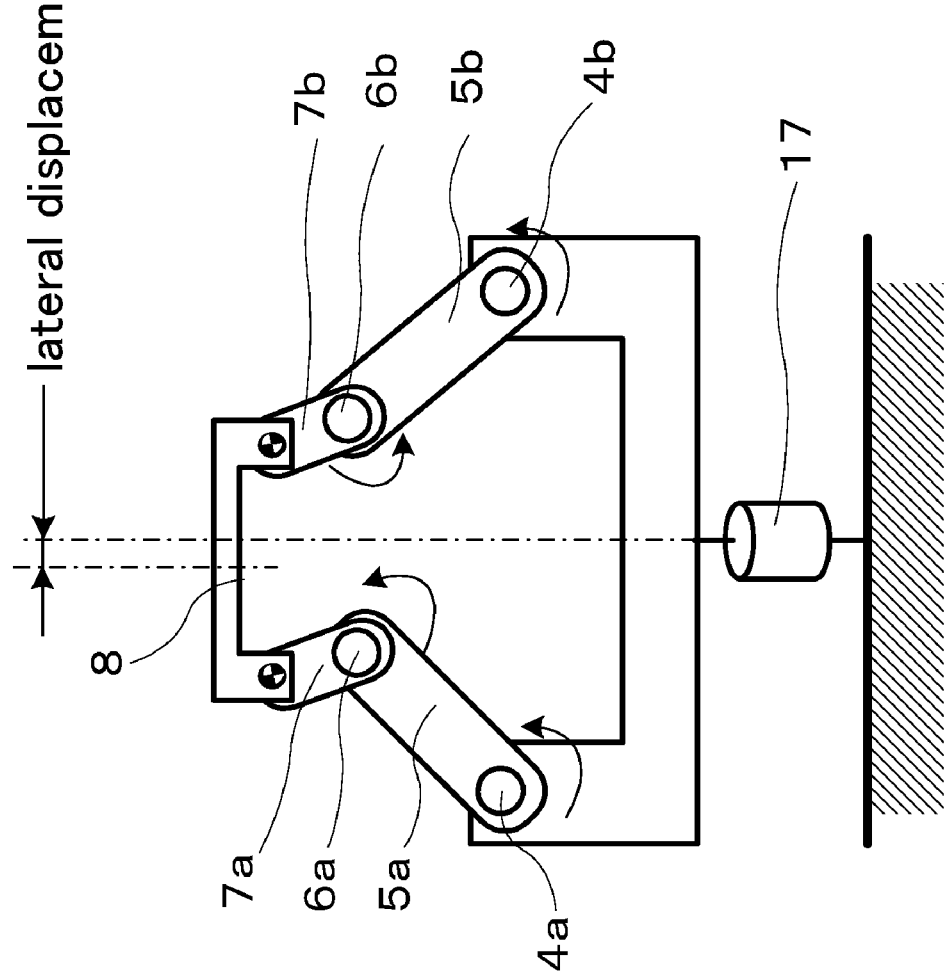
FIG. 5 is a schematic view illustrating movement of a lift mechanism for correcting displacement in the lateral direction according to the present invention.

Next, referring to FIG. 5, correction movement performed when the cabinet is disposed in a laterally displaced position with respect to the direction in which the hand is moved will be described. FIG. 5 is a schematic view of the lift mechanism viewed from the direction in which a workpiece is transferred to the cabinet.

When the cabinet is disposed with a lateral displacement, the first leg section 5a rotates the first joint 4a counterclockwise by an angle θ from a horizontal state, and the second leg section 7a rotates the second joint 6a clockwise by the angle θ from a horizontal state. The first leg section 5b rotates the first joint 4b clockwise by the angle θ from a horizontal state, and the second leg section 7b rotates the second joint 6b clockwise by the angle θ from a horizontal state. Thus, the supporting base 8 can be moved laterally while maintaining a horizontal state, and a horizontal arm mechanism (not shown) disposed on the supporting base 8 can be moved laterally while maintaining a horizontal state.

The cases in which the cabinet is disposed at an angle or disposed with a lateral displacement have been described. However, it is possible that a workpiece is disposed at an angle or with a lateral displacement in the cabinet. Regarding the inclination of the workpiece, it is necessary to consider an inclination in the yaw direction, and it is not necessary to consider an inclination in the roll direction with respect to the direction in which the workpiece is transferred. This is because an inclination of the workpiece in the roll direction, which may be caused by an inclination of a surface of the cabinet on which the workpiece is disposed, does not usually occur because the interior of the cabinet is manufactured with high precision.

Figure 6:
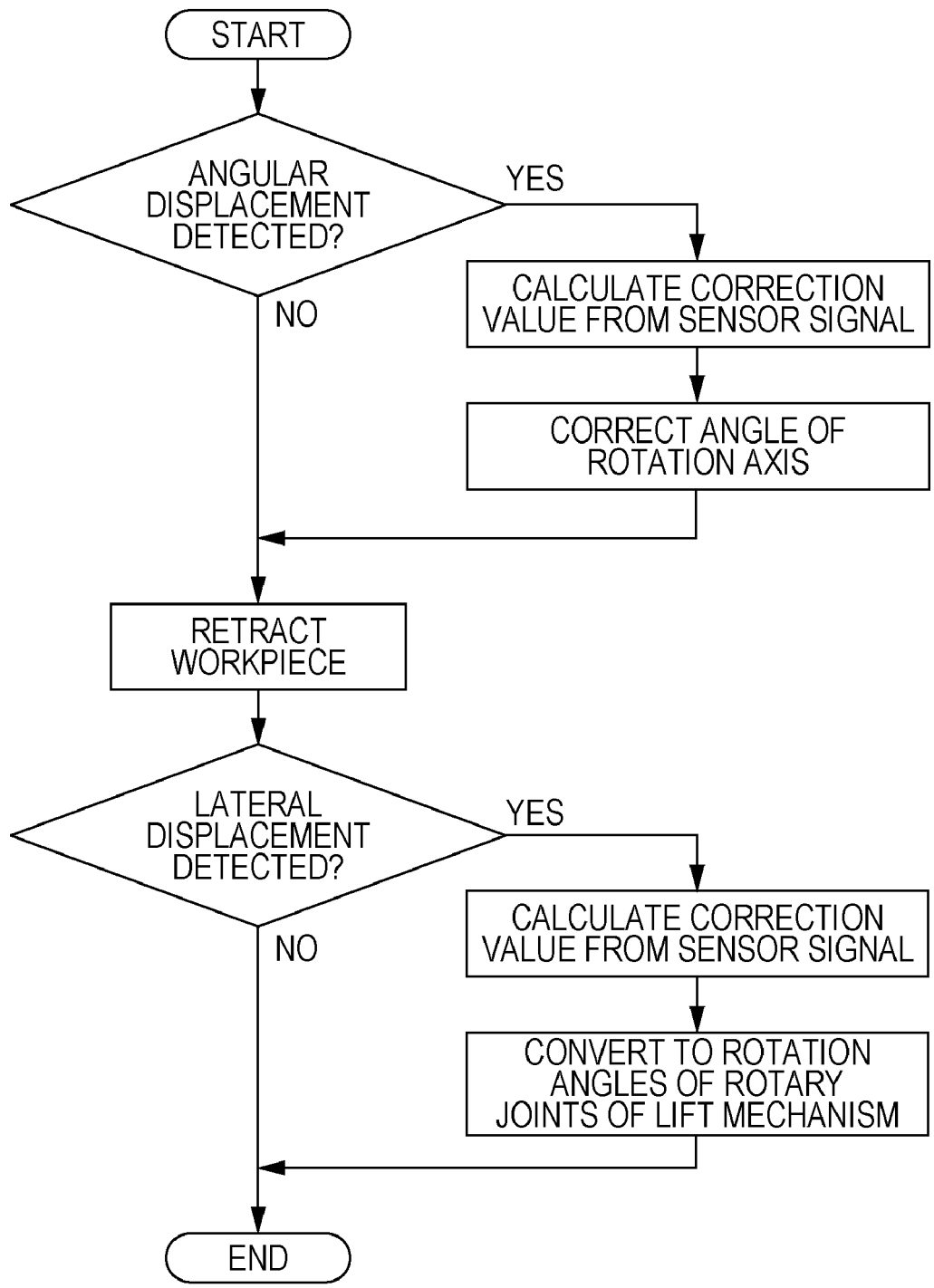
FIG. 6 is a flowchart illustrating a process of correcting displacement of a workpiece placed on a hand.

Referring to the flowchart of FIG. 6, correction of an inclination in the yaw direction and a lateral displacement will be described.

(1) A workpiece is placed on a hand of the robot.

(2) An angular displacement is detected from a relative angle of two sensors (not shown) disposed on the hand.

(3) The angular displacement detected in step 2 is corrected by being converted to a rotation angle of the rotation mechanism.

(4) When the workpiece placed on the hand of the robot has been retracted, lateral displacement is detected with distance detection sensors disposed on the supporting base and the supporting member.

(5) If there is lateral displacement, the position is corrected by converting the amount of the lateral displacement to rotation angles of the joints.

(6) The robot is moved to a work area while maintaining the position in which the angle and the position have been corrected.

With these steps, displacement in the yaw direction and in the lateral direction of a workpiece placed on the hand can be corrected.

The sensors for detecting angular displacement are disposed on members of the hands 14a and 14b, respectively, to which the third horizontal joints 13a and 13b are attached as illustrated in FIG. 1. Reflective proximity sensors or the like can be used as these sensors. The distance detection sensors for detecting lateral displacement, which are transmission sensors, are respectively disposed on an upper surface of the supporting base 8, to which the first arm section 10a is attached, and on the lower surface of the supporting member 16, to which the first arm section 10b is attached, so as to face each other. The distance detection sensors are disposed at positions in the vicinity of the supporting column 15 through which a side of a workpiece passes.

Even if the sensors for detecting angular displacement are not provided to the hand, inclination of a workpiece in the yaw direction can be detected if the detected values of the transmission sensors vary when the hand is retracted to a space between the supporting base and the supporting member. The inclination in the yaw direction can be calculated from the difference in the detected values. The inclination that has been calculated can be corrected by converting the inclination to a rotation angle around the rotation axis.

Next, referring to FIG. 1, movement of the horizontal arm mechanism 30 will be described. First ends of the first arm sections 10a and 10b are respectively connected to the supporting base 8 and the supporting member 16. Second ends of the first arm sections 10a and 10b are respectively connected to first ends of the second arm sections 12a and 12b via the second horizontal joints 11a and 11b. Second ends of the second arm sections 12a and 12b are respectively connected to the hands 14a and 14b via the third horizontal joints 13a and 13b. When rotation drive mechanisms included in the supporting base 8 and the supporting member 16 are driven, the driving force is transmitted to the horizontal joints through, for example, a belt drive, and the hands 14a and 14b are moved in one direction. The hand 14a is illustrated to be at a position at which the arms are extended, and the hand 14b is illustrated to be at a position at which the arms are contracted. In the present embodiment, in the upper and lower parts of the horizontal arm mechanism 30, the second horizontal joints 11a and 11b are extended toward opposite directions. However, this is not a limitation, and, for example, the second horizontal joints 11a and 11b may be moved in a horizontal direction opposite the supporting column 15.

In the present invention, a multi-joint robot having upper and lower arms has been described. However, it is self-evident that the present invention can be applied to a multi-joint robot having an upper arm or a lower arm. A transfer robot having rotary joints as the first to third horizontal joints have been described. However, it is clear that a transfer robot having a third horizontal joint that is fixed has similar function and advantages.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A transfer robot comprising:
a horizontal arm mechanism including a hand section on which an object can be placed, a second arm that rotatably supports the hand section, and a first arm that rotatably supports the second arm, the first and second arms rotating so that the hand section moves in a direction; and
a lift mechanism that moves the horizontal arm mechanism up and down,
wherein the lift mechanism includes a first link mechanism including a first-side first leg section that is rotatably supported on a first side of a base via a first-side first joint and a first-side second leg section that is rotatably supported by the first-side first leg section via a first-side second joint, the first-side second leg section supporting the horizontal arm mechanism, and a second link mechanism including a second-side first leg section that is rotatably supported on a second side of the base via a second-side first joint and a second-side second leg section that is rotatably supported by the second-side first leg section via a second-side second joint, the second-side second leg section supporting the horizontal arm mechanism, wherein the first-side first joint, the second-side first joint, the first-side second joint, and the second-side second joint are disposed so that rotation axes thereof are parallel to the direction in which the hand section moves, and wherein the hand section is moved up and down between the first-side first joint and the second-side first joint while the first-side first leg section and the second-side first leg section rotate in opposite directions in such a manner that the first-side second joint and the second-side second joint are moved within a space between the first-side first joint and the second-side first joint, as viewed from the direction in which the hand section moves.

2. The transfer robot according to claim 1,
wherein the base includes a first-side leg supporting member that extends upward from a first end of the base and a second-side leg supporting member that extends upward from a second end of the base, wherein the first-side first leg section is rotatably supported on an upper end of the first-side leg supporting member via the first-side first joint and the second-side first leg section is rotatably supported on an upper end of the second-side leg supporting member via the second-side first joint, and wherein the first-side first leg section is longer than the first-side leg supporting member and the second-side first leg section is longer than the second-side leg supporting member.

3. The transfer robot according to claim 1,
wherein the first-side second leg section is rotatably supported on an end of the first-side first leg section via the first-side second joint, the first-side second leg section being shorter than the first-side first leg section, and wherein the second-side second leg section is rotatably supported on an end of the second-side first leg section via the second-side second joint, the second-side second leg section being shorter than the second-side first leg section.

4. The transfer robot according to claim 1,
wherein the first-side first joint and the second-side first joint include drive mechanisms that respectively drive the first-side first leg section and the second-side first leg section, and wherein the first-side second joint and the second-side second joint include drive mechanisms that respectively drive the first-side second leg section and the second-side second leg section.

5. The transfer robot according to claim 1,
wherein a link length of the first-side first leg section is equal to a link length of the second-side first leg section, and a link length of the first-side second leg section is equal to a link length of the second-side second leg section.

6. The transfer robot according to claim 1, further comprising:
a rotation mechanism that rotates the base around a rotation axis extending through a central portion of the base.

7. The transfer robot according to claim 1,
wherein the horizontal arm mechanism includes
a lower-side link arm mechanism including a lower-side hand section on which the object can be placed, a lower-side second arm that rotatably supports the lower-side hand section via a lower-side third horizontal joint, and a lower-side first arm that rotatably supports the lower-side second arm via a lower-side second horizontal joint, an upper-side link arm mechanism including an upper-side hand section on which the object can be placed, an upper-side second arm that rotatably supports the upper-side hand section via an upper-side third horizontal joint, and an upper-side first arm that rotatably supports the upper-side second arm via an upper-side second horizontal joint, a supporting base that rotatably supports the lower-side first arm via a lower-side first horizontal joint, the supporting base being supported by the first-side second leg section and the second-side second leg section, a supporting member that rotatably supports the upper-side first arm via an upper-side first horizontal joint, and a supporting column that supports an end of the supporting member, the supporting column standing on an end of the supporting base, wherein the lower-side link arm mechanism and the upper-side link arm mechanism are disposed so as to face each other in up-down directions between the supporting member and the supporting base, and the lower-side link arm mechanism and the upper-side link arm mechanism move between the supporting member and the supporting base.

8. The transfer robot according to claim 7,
wherein a rotation axis of the lower-side first horizontal joint and a rotation axis of the upper-side first horizontal joint are disposed so as to coincide with the same vertical axis.

9. The transfer robot according to claim 7,
wherein the lower-side second horizontal joint of the lower-side link arm mechanism and the upper-side second horizontal joint of the upper-side link arm mechanism are moved toward different sides with respect to an axis extending in the direction in which the lower-side hand section and the upper-side hand section move.

10. The transfer robot according to claim 7, further comprising:
a rotation mechanism that rotates the base,
wherein a rotation axis of the lower-side first horizontal joint and a rotation axis of the upper-side first horizontal joint are disposed at positions offset from a rotation axis of the rotation mechanism in the direction in which the lower-side hand section and the upper-side hand section move.

11. A control method for a transfer robot, the transfer robot including a horizontal arm mechanism including a hand section on which an object can be placed, a second arm that rotatably supports the hand section, and a first arm that rotatably supports the second arm, the first and second arms rotating so that the hand section moves in a direction; and a lift mechanism that moves the horizontal arm mechanism up and down, the lift mechanism including a first link mechanism including a first-side first leg section that is rotatably supported on a base via a first-side first joint and a first-side second leg section that is rotatably supported by the first-side first leg section via a first-side second joint, the first-side second leg section supporting the horizontal arm mechanism, and a second link mechanism including a second-side first leg section that is rotatably supported on the base via a second-side first joint and a second-side second leg section that is rotatably supported by the second-side first leg section via a second-side second joint, the second-side second leg section supporting the horizontal arm mechanism, wherein the first-side first joint, the second-side first joint, the first-side second joint, and the second-side second joint are disposed so that rotation axes thereof are parallel to the direction in which the hand section moves, the control method comprising:

moving the hand section up and down between the first-side first joint and the second-side first joint while rotating the first-side first leg section and the second-side first leg section in opposite directions in such a manner that the first-side second joint and the second-side second joint are moved within a space between the first-side first joint and the second-side first joint, as viewed from the direction in which the hand section moves.

12. The control method for the transfer robot according to claim 11, wherein the lift mechanism moves the horizontal arm mechanism up and down by simultaneously rotating the first-side first leg section and the second-side first leg section and simultaneously rotating the first-side second leg section and the second-side second leg section while horizontally supporting the horizontal arm mechanism.

13. The control method for the transfer robot according to claim 11, wherein the transfer robot includes a first-side leg supporting member that extends upward from a first end of the base and a second-side leg supporting member that extends upward from a second end of the base, and the first-side first leg section is rotatably supported on an upper end of the first-side leg supporting member via the first-side first joint and the second-side first leg section is rotatably supported on an upper end of the second-side leg supporting member via the second-side first joint, and wherein, when moving the hand section to a lowest position, the hand section is moved down by rotating the first-side first leg section and the second-side first leg section so that the first-side first leg section and the second-side first leg section respectively overlap the first-side leg supporting member and the second-side leg supporting member, as viewed from the direction in which the hand section moves.

\* \* \* \* \*